United States Patent
Tanizawa

(10) Patent No.: US 9,376,754 B2
(45) Date of Patent: Jun. 28, 2016

(54) THIN FILM FORMING METHOD

(71) Applicant: Mitsui Engineering & Shipbuilding Co., Ltd., Chuo-ku, Tokyo (JP)

(72) Inventor: Kazuki Tanizawa, Tamano (JP)

(73) Assignee: MITSUI ENGINEERING & SHIPBUILDING, Tokyo (JP)

( * ) Notice: Subject to any disclaimer, the term of this patent is extended or adjusted under 35 U.S.C. 154(b) by 66 days.

(21) Appl. No.: 14/046,672

(22) Filed: Oct. 4, 2013

(65) Prior Publication Data

US 2015/0099058 A1 Apr. 9, 2015

Related U.S. Application Data

(62) Division of application No. 13/147,891, filed as application No. PCT/JP2010/000482 on Jan. 28, 2010, now abandoned.

(30) Foreign Application Priority Data

Feb. 12, 2009 (JP) .................................. 2009-030325

(51) Int. Cl.
*C23C 16/34* (2006.01)
*C23C 16/40* (2006.01)
(Continued)

(52) U.S. Cl.
CPC .................. *C23C 16/52* (2013.01); *C23C 16/34* (2013.01); *C23C 16/40* (2013.01); *C23C 16/4554* (2013.01)

(58) Field of Classification Search
CPC ........ C23C 16/34; C23C 16/40; C23C 16/52; C23C 16/4554
See application file for complete search history.

(56) References Cited

U.S. PATENT DOCUMENTS 5,405,488 A * 4/1995 Dimitrelis ......... H01J 37/32963
216/60
5,780,315 A 7/1998 Chao et al.
(Continued)

FOREIGN PATENT DOCUMENTS

JP 09-289202 A 11/1997
JP 2000-150493 A 5/2000
(Continued)

OTHER PUBLICATIONS

Kim, Ju Youn, et al., "Deposition and Plasma Measurements of Zr—Oxide Films with Low Impurity Concentrations by Remote PEALD". Electrochemical and Solid-State Letters, 8 (3) G82-G84 (2005).*
(Continued)

*Primary Examiner* — Bret Chen
(74) *Attorney, Agent, or Firm* — Global IP Counselors, LLP

(57) ABSTRACT

A method includes introducing an organic metal gas containing hydrogen into a deposition vessel to cause a component of the organic metal containing hydrogen to be adsorbed on a substrate; introducing an oxidizing gas or a nitriding gas into the vessel, generating plasma with the oxidizing gas or the nitriding gas by a plasma source, and oxidizing or nitriding the component; detecting emission intensity of a wavelength of light through an observation window in the vessel, the light being emitted, by generating the plasma, from an excited hydrogen radical resulting from the hydrogen separated from the organic metal above the substrate when the organic metal reacts with the oxidizing gas or the nitriding gas to form an oxidized metal or a nitride metal on the substrate; and stopping the generation of the plasma when a value of the detected emission intensity becomes a first predetermined value or less.

5 Claims, 3 Drawing Sheets

(51) Int. Cl.
C23C 16/52 (2006.01)
C23C 16/455 (2006.01)

(56) References Cited

U.S. PATENT DOCUMENTS

| | | | |
|---|---|---|---|
| 6,060,391 A | 5/2000 | Tatsumi | |
| 6,339,297 B1* | 1/2002 | Sugai | H01J 37/32082 |
| | | | 315/111.21 |
| 6,686,287 B1 | 2/2004 | Dohi | |
| 8,440,268 B2 | 5/2013 | Washio et al. | |
| 2002/0183977 A1* | 12/2002 | Sui | H01J 37/32935 |
| | | | 702/188 |
| 2003/0008072 A1 | 1/2003 | Lee et al. | |
| 2003/0143841 A1* | 7/2003 | Yang | C23C 16/06 |
| | | | 438/656 |
| 2005/0009347 A1 | 1/2005 | Matsumoto et al. | |
| 2006/0093731 A1 | 5/2006 | Sekine et al. | |
| 2007/0020923 A1* | 1/2007 | Kraus | C23C 16/34 |
| | | | 438/644 |
| 2007/0031599 A1 | 2/2007 | Gschwandtner et al. | |
| 2007/0277735 A1 | 12/2007 | Mokhlesi et al. | |
| 2008/0182411 A1 | 7/2008 | Elers | |
| 2009/0090616 A1* | 4/2009 | Du | C23C 16/24 |
| | | | 204/192.13 |
| 2009/0297696 A1* | 12/2009 | Pore | C23C 16/405 |
| | | | 427/79 |
| 2011/0293854 A1* | 12/2011 | Takizawa | 427/569 |

FOREIGN PATENT DOCUMENTS

| | | |
|---|---|---|
| JP | 2006-274420 A | 10/2006 |
| JP | 2007-527621 A | 9/2007 |
| JP | 2008-184686 A | 8/2008 |
| TW | 200741027 A | 11/2007 |

OTHER PUBLICATIONS

Hermann, J., et al., "Plasma diagnostics in pulsed laser TiN layer deposition". J. Appl. Phys. 77 (7), Apr. 1, 1995, pp. 2928-2936.*
Parsons, Gregory N., et al., "Reaction processes for low temperature (<150C) plasma enhanced deposition of hydrogenated amorphous silicon thin film transistors on transparent plastic substrates". Mat. Res. Soc. Symp. Proc. vol. 508, Symposium B—Flat Panel Display Materials 1998.*
International Search Report of corresponding International Application No. PCT/JP2010/00482, dated on Apr. 6, 2010.
Office Action of the corresponding Taiwanese patent application, dated Mar. 14, 2014.
Search Report in the corresponding European Patent Application No. 10741037.5 dated Jul. 14, 2015.

* cited by examiner

THIN FILM FORMING METHOD

CROSS-REFERENCE TO RELATED APPLICATIONS

This application is a divisional application of U.S. patent application Ser. No. 13/147,891 filed on Aug. 4, 2011, which is a U.S. National stage of International Application No. PCT/JP2010/000482 filed on Jan. 28, 2010. U.S. patent application Ser. No. 13/147,891 claims priority to Japanese Patent Application No. 2009-030325 filed with Japan Patent Office on Feb. 12, 2009. The entire disclosures of Japanese Patent Application No. 2009-030325 and the U.S. patent application Ser. No. 13/147,891 are hereby incorporated herein by reference.

TECHNICAL FIELD

The present invention relates to an atomic layer growing apparatus and a thin film forming method for forming a thin film on a substrate, on which a component of an organic metal containing hydrogen is adsorbed, by generating plasma using an oxidizing gas or a nitriding gas.

BACKGROUND ART

There is well known an atomic layer growing method (hereinafter also abbreviated to an ALD (Atomic Layer Deposition) method) for forming a thin film on a substrate in units of atomic layers. In the ALD, two types of gases that mainly contain elements constituting a film to be deposited are alternately supplied onto the deposition target substrate, and the thin film is formed on the substrate in units of atomic layers. A film having a desired thickness is formed by repeatedly forming the thin film in units of atomic layers. For example, a source gas containing TMA (Tri-Methyl Aluminum) and the oxidizing gas containing O are used when an $Al_2O_3$ film is formed on the substrate. The nitriding gas is used instead of the oxidizing gas when a nitride film is formed on the substrate.

A so-called self-stopping action (self-limit function) of growth is utilized in the ALD method. That is, in the self-stopping action of growth, only one or several layers of source gas components are adsorbed on a substrate surface during supply of the source gas, and the excess source gas does not contribute to the growth of the thin film.

The thin film formed by the ALD method has both a high step coverage characteristic and a high film-thickness control characteristic compared with the thin film formed by a general CVD (Chemical Vapor Deposition) method. Therefore, the ALD method is expected to become commonplace in forming a capacitor of a memory element and an insulating film called a "high-k gate". Because the insulating film can be formed at a low temperature of about 300° C., the ALD method is also expected to be applied to formation of a gate insulating film of a thin film transistor in a display device, such as a liquid crystal display, in which a glass substrate is used.

In the ALD method, the source gas component adsorbed on the substrate is oxidized by utilizing an oxygen radical that is generated by generating the plasma using the oxidizing gas. At this point, the process is performed while a plasma generation time is fixed to hundreds milliseconds to several seconds. For example, Patent Document 1 describes plasma ALD for a tantalum nitride film. In Patent Document 1, a $H_2$ plasma pulse generation time used for reduction is fixedly set to 2000 to 4000 milliseconds (see paragraph [0064] of Patent Document 1).

PRIOR ART DOCUMENT

Patent Document

Patent Document 1: Japanese Patent Application Laid-Open No. 2008-184688

In the ALD method, when the plasma is generated using the oxidizing gas or the nitriding gas in order to form the oxide film or the nitride film, unfortunately a thickness and characteristics (compactness of substance, a breakdown characteristic and a refractive index) of the thin film such as the oxide film and the nitride film unevenly vary according to a density distribution of the generated plasma.

SUMMARY OF INVENTION

Technical Problem

In order to solve the problem, an object of the invention is to provide an atomic layer growing apparatus and a thin film forming method for being able to efficiently form the thin film such that the thickness and characteristics of the thin film such as the oxide film and the nitride film become even.

Solution to Problem

According to an aspect of the invention, a thin film forming method for forming a thin film, includes the steps of:

introducing an organic metal gas containing hydrogen into a deposition vessel to cause a component of the organic metal containing hydrogen to be adsorbed on a substrate;

introducing an oxidizing gas or a nitriding gas into the deposition vessel, generating plasma with the oxidizing gas or the nitriding gas by a plasma source, and oxidizing or nitriding the component of the organic metal adsorbed on the substrate;

detecting emission intensity of a wavelength of light through an observation window provided in the deposition vessel, the light being emitted, by generating the plasma, from an excited hydrogen radical resulting from the hydrogen separated from the organic metal above the substrate when the organic metal reacts with the oxidizing gas or the nitriding gas to form an oxidized metal or a nitride metal on the substrate; and stopping the generation of the plasma when a value of the detected emission intensity becomes a first predetermined value or less.

Advantageous Effect of Invention

In the atomic layer growing apparatus and the thin film forming method, the emission intensity of the predetermined wavelength of the light emitted on the substrate is detected through the observation window provided in the deposition vessel, and the supply of the high-frequency power to the plasma source is stopped when the value of the detected emission intensity becomes the predetermined value or less. Because the substrate is exposed to the plasma only for the necessary time, the thin film is not unevenly formed according to the plasma generation density distribution. That is, the thin film can efficiently be formed such that the thickness and characteristics of the thin film become even.

DESCRIPTION OF EMBODIMENT

Figure 1:
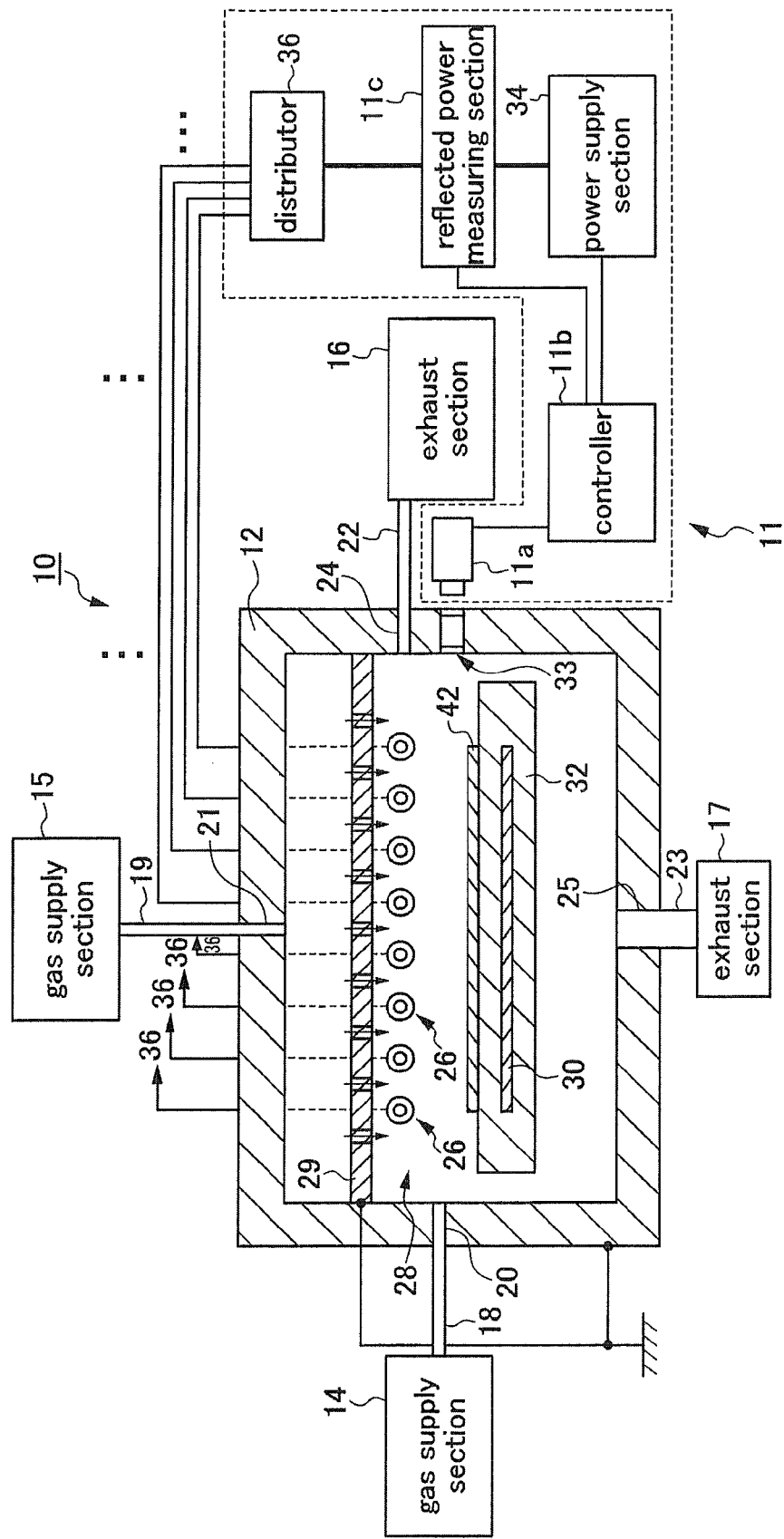
FIG. 1 is a schematic diagram illustrating a configuration of an ALD apparatus that is an atomic layer growing apparatus according to an embodiment of the invention.
Figure 2:
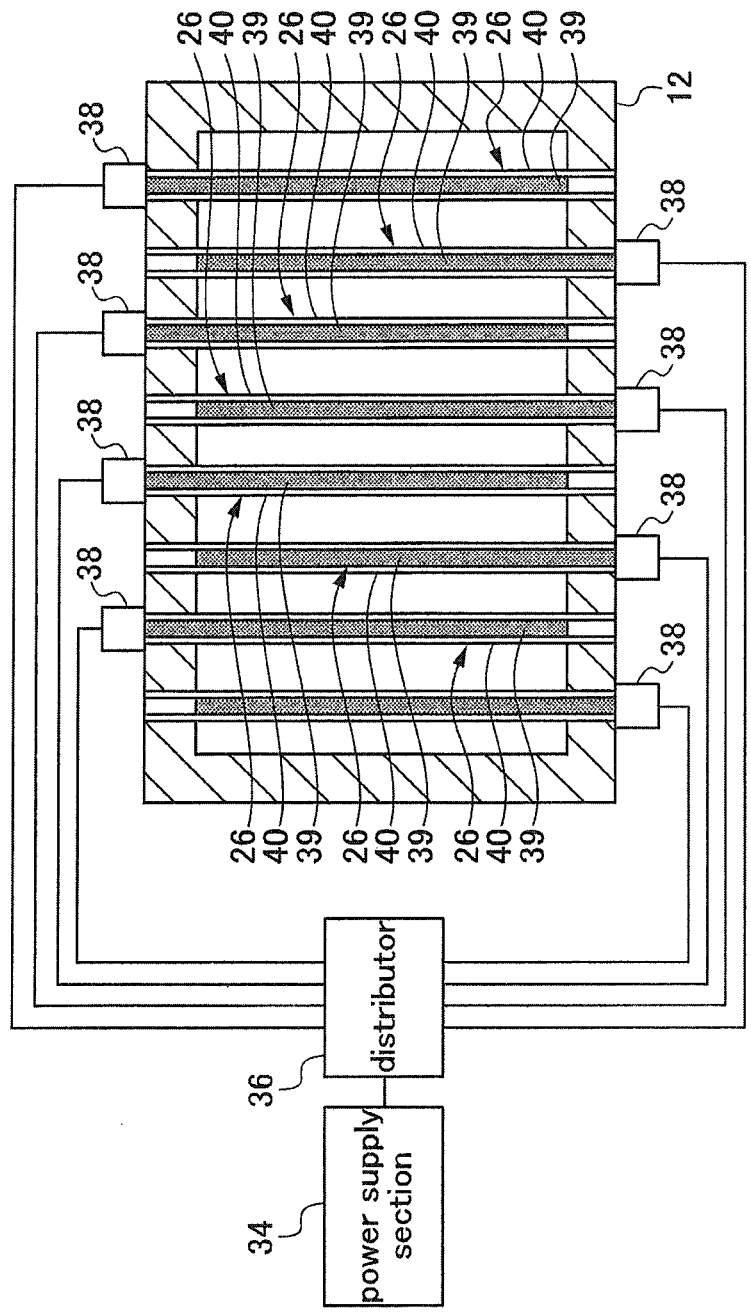
FIG. 2 is a view for explaining an antenna array and a feed unit in the ALD apparatus of FIG. 1.

Hereinafter, an atomic layer growing apparatus and a thin film forming method according to an exemplary embodiment of the invention will be described in detail. FIG. 1 is a schematic diagram illustrating a configuration of an ALD apparatus that is an atomic layer growing apparatus according to an embodiment of the invention. FIG. 2 is a view for explaining an antenna array and a feed unit in the ALD apparatus of FIG. 1.

An ALD apparatus 10 illustrated in FIG. 1 forms a thin film using an organic metal source gas, such as TMA (Tri-Methyl Aluminum) which has hydrogen and an oxidizing gas containing O. Then, the ALD apparatus 10 alternately supplies the organic metal source gas and the oxidizing gas onto a substrate 42 that is a deposition target. While supplying the oxidizing gas, the ALD apparatus 10 generates plasma using the oxidizing gas containing O in order to enhance reaction activity and forms the metallic oxide thin film on the substrate in units of atomic layers. The above-described process is repeated plural cycles to form the thin film having a desired thickness. A nitriding gas can be used instead of the oxidizing gas. When TMA is used as the organic metal, the thin film made of $Al_2O_3$ is formed on the substrate.

The ALD apparatus 10 includes a feed unit 11, a deposition vessel 12, gas supply sections 14 and 15, and exhaust sections 16 and 17 such as a vacuum pump. The case in which an oxide film is formed on the substrate will be described by way of example. The same holds true for a nitride film.

The feed unit 11 supplies a power (high-frequency signal) to each antenna element 26 of an antenna array provided in the deposition vessel 12. The feed unit 11 includes a photosensor 11a, a controller 11b, a reflected power measuring section 11c, a power supply section 34, and a distributor 36. As illustrated in FIG. 2, the distributor 36 supplies the high-frequency signal produced by the power supply section 34 to each antenna element 26. Lengths of feed lines from the distributor 13 to the antenna element 26 are equal to one another.

The gas supply section 14 is connected through a supply pipe 18 to a supply hole 20 made in one (left wall in FIG. 1) of sidewalls of the deposition vessel 12. The gas supply section 14 horizontally supplies a hydrogen-containing organic metal gas that is the source gas into the deposition vessel 12 through the supply pipe 18 and the supply hole 20. The gas supply section 15 is connected through a supply pipe 19 to a supply hole 21 made in an upper wall of the deposition vessel 12. The gas supply section 15 vertically supplies an oxidizing gas to the substrate in the deposition vessel 12 through the supply pipe 19 and the supply hole 21. The source gas and the oxidizing gas are alternately supplied.

In the embodiment, the gas supply section 14 supplies the organic metal gas that is the source gas into the deposition vessel 12 through the supply pipe 18 and the supply hole 20 while the gas supply section 15 supplies the oxidizing gas into the deposition vessel 12 through the supply pipe 19 and the supply hole 21. Alternatively, the gas supply section 14 may supply the oxidizing gas into the deposition vessel 12 through the supply pipe 18 and the supply hole 20 while the gas supply section 15 supplies the organic metal gas that is the source gas into the deposition vessel 12 through the supply pipe 19 and the supply hole 21.

On the other hand, the exhaust section 16 is connected through an exhaust pipe 22 to an exhaust hole 24 made in a right wall of the deposition vessel 12. The exhaust section 16 horizontally exhausts the source gas and the oxidizing gas, which are alternately supplied into the deposition vessel 12, through the exhaust hole 24 and the exhaust pipe 22. The exhaust section 17 vertically evacuates the deposition vessel 12 through an exhaust hole 25 and an exhaust pipe 23. The source gas and the oxidizing gas are alternately exhausted.

Although not illustrated, on-off valves (for example, electromagnetic valve) that control communication between the gas supply sections 14 and 15 and the deposition vessel 12 are provided in the middles of the supply pipes 18 and 19, respectively, and on-off valves that control communication between the exhaust sections 16 and 17 and the deposition vessel 12 are provided in the middles of the exhaust pipes 22 and 23, respectively.

When the source gas is supplied from the gas supply section 14 into a deposition chamber 28 of the deposition vessel 12, the on-off valve of the supply pipe 18 is opened to supply the source gas into the deposition chamber 28. When the oxidizing gas is supplied from the gas supply section 15 into the deposition chamber 28 of the deposition vessel 14, the on-off valve of the supply pipe 19 is opened to supply the oxidizing gas. When the supplied gas is exhausted, the on-off valve of the exhaust pipe 22 is opened. On the other hand, when the deposition vessel 12 is evacuated, the on-off valve of the exhaust pipe 23 is opened.

The metallic hollow-box-shaped deposition vessel 12 is grounded. A metallic plate-shaped shower head 29 in which plural holes having predetermined diameters are made, an antenna array that includes plural antenna elements 26 and a substrate stage 32 in which a heater 30 is incorporated are sequentially provided from an upper wall side toward a lower wall side in the deposition vessel 12. The deposition vessel 12 and the shower head 29 are grounded. The antenna array is provided such that a virtual plane on which the antenna elements 26 are arrayed becomes parallel to the substrate stage 32.

For example, the shower head 29 is a metallic rectangular member. As illustrated in FIG. 1, the shower head 29 is attached to an inside wall surface of the deposition vessel 12 between the upper wall of the deposition vessel 12 and the antenna array while being parallel to the substrate stage 32. In the shower head 29, the plural holes are made in an intermittent manner (at predetermined intervals) while located on both sides (right and left in FIG. 1) of each of the plural antenna elements 26. The plural holes are made into long and thin shapes along a longitudinal direction (direction perpendicular to the paper surface in FIG. 1) of each of the plural antenna elements 26.

The oxidizing gas supplied from the gas supply section 15 into the deposition chamber 28 is diffused in a space between an upper wall of the deposition chamber 28 and an upper surface of the shower head 29. Then the oxidizing gas is introduced (supplied) to a space below the shower head 29 from an upper side toward a lower side of the deposition vessel 12 through the plural holes made in the shower head 29.

The antenna array generates the plasma using the oxidizing gas. In the deposition vessel 12, the antenna array is provided between the left wall in which the supply hole 20 is made and the right wall in which the exhaust hole 24 is made, and the antenna array is provided in a space between the shower head 29 and the substrate stage 32 while being parallel to the surface of the substrate stage 32. The plural antenna elements 26 constituting the antenna array are disposed in parallel at constant intervals. Each of the plural antenna elements 26 is deviated in the horizontal direction (right-and-left direction in FIG. 1) of the deposition vessel 12 so as not to be located immediately below the plural holes of the shower head 29, which supplies the oxidizing gas.

As illustrated in FIG. 2, a high-frequency signal (high-frequency power) having a VHF band (for example, 80 MHz) generated by the power supply section 34 is supplied to the distributor 36 to divide the high-frequency signal. The high-frequency signals are supplied to base portions, from which the plural antenna elements 26 are projected, through an impedance matching box 38. The impedance matching box 38 adjusts impedance mismatch generated by change in load of the antenna element 26 during the generation of the plasma.

The antenna element 26 is configured such that a rod-shaped conductive monopole antenna (antenna body) 39 made of copper, aluminum, platinum or the like is accommodated in a cylindrical member 40 made of a dielectric material such as quartz and ceramic. A capacitance and an inductance are adjusted as the antenna by coating the antenna body 39 with the dielectric material, and the high-frequency signal can efficiently be propagated along the longitudinal direction of the antenna body 39. Therefore, the antenna element 26 can efficiently radiate an electromagnetic wave to the surroundings.

Each of the antenna elements 26 extends in a direction orthogonal to a flow direction of the source gas supplied from the supply hole 20 toward the substrate stage 32, and the antenna element 26 is attached in the electrically insulating manner so as to be projected from the sidewall of the deposition vessel 12. The antenna elements 26 are disposed in parallel at constant intervals, for example, intervals of 50 mm, and feed positions of two antenna elements adjacent to each other among the antenna elements 26 are located on the sidewalls opposite each other.

Each of the antenna elements 26 is disposed in parallel with a substrate placing surface of the substrate stage 32. The direction in which the plural antenna elements 26 are arrayed is parallel to the substrate placing surface of the substrate stage 32.

For example, the antenna element 26 is configured such that the antenna body having a diameter of about 6 mm is provided in the dielectric cylindrical member having a diameter of about 12 mm. For the deposition vessel 12 whose pressure is about 20 Pa, when the high-frequency signal having the power of about 1600 W is supplied from the feed unit 11, a standing wave of the high-frequency signal is generated on a condition that an antenna length of each antenna element 26 is equal to $(2n+1)/4$ (n is 0 or positive integer) times of a wavelength of the high-frequency signal, whereby the antenna element 26 becomes a resonant state. Therefore, the electromagnetic wave is radiated to the surroundings of the antenna elements 26 to generate the plasma.

The substrate stage 32 has an area smaller than a section of a space surrounded by the inside walls of the deposition vessel 12. For example, the substrate stage 32 is a metallic rectangular plate. The substrate stage 32 is vertically lifted and lowered by a lifting mechanism (not illustrated) such as a power cylinder. The substrate 42 on which the thin film is formed is placed on the substrate stage 32.

The feed unit 11 includes the photosensor 11a, the controller 11b, the reflected power measuring section 11c, the power supply section 34, and the distributor 36.

An observation window 33 made of a transparent material such as quartz is provided in the sidewall of the deposition vessel 12 above the substrate 42 placed on the substrate stage 32.

The photosensor 11a is provided in a portion corresponding to the observation window 33 on the outside of the deposition vessel 12. A bandpass filter that transmits light having a predetermined wavelength is provided in front of a light receiving surface of the photosensor 11a. Therefore, the photosensor 11a is configured so as to receive light having a specific wavelength to detect emission intensity. A signal output from the photosensor 11a is transmitted to the controller 11b. In the bandpass filter, at least a wavelength band of 655.3 to 657.3 nm is set to a transmission band in order to mainly detect light emission of a hydrogen radical having a wavelength of 656.3 nm.

For the following reason, the observation window 33 is provided in the deposition vessel 12 to detect the light having the predetermined wavelength.

That is, the oxygen radical that is generated by dissociating from the oxidizing gas in the plasma reacts with a hydrogen-atom-containing organic metal molecule adsorbed on the substrate 42, and the hydrogen radical produced at that time is excited in the plasma to emit specific light. The photosensor 11a detects the emitted light, and the detection result is used to control the plasma generation.

More specifically, the hydrogen radical is generated when a component of the organic metal adsorbed on the substrate is oxidized using the oxygen radical. The light having the specific wavelength is emitted when the hydrogen radical is excited in the plasma. Because the organic metal such as TMA contains the hydrogen atom, when the oxidation reaction is generated on the substrate on which the component of the organic metal is adsorbed, the hydrogen atom of the organic metal adsorbed on the substrate surface is separated from a metallic atom, and instead the oxygen radical is coupled to the metallic atom to oxidize the metallic atom. The separated hydrogen radical is excited in the plasma. The light emission is generated when the hydrogen radical is stabilized. Because the light emission of the hydrogen radical is generated when the oxygen radical reacts with the component of the organic metal, the light emission of the hydrogen radical is detected to check a change in light intensity, which allows progression of the metallic oxidation reaction to be learned. When the oxidation reaction is ended, the oxidation does not progress any more even if the oxygen radical is supplied. Therefore, henceforth it is not necessary to continue the plasma generation. When the plasma generation is continued, there is an increasing risk of damaging the oxide film formed by the plasma. Accordingly, the feed unit 11 can learn the progression of the oxidation reaction by detecting the emission intensity of the hydrogen radical, and the feed unit 11 performs the control so as to end the plasma generation when the progression of the oxidation reaction is ended.

The reflected power measuring section 11c measures a voltage and a current of the high-frequency signal from the power supply section 34 to measure a reflected power reflected by the antenna element 26. The measured reflected power is transmitted to the controller 11b. The reason the reflected power is measured is that a start time of the plasma generation is learned by the feed of the high-frequency power. The plasma generation is not immediately started by the feed of the high-frequency power, but the plasma is generated at the time resonance is generated and the reflected power is lowered. The time until the resonance is generated varies. Accordingly, the feed unit 11 learns the time the plasma generation is started, and the feed unit 11 starts to detect a value of the emission intensity using the photosensor 11a based on the time the reflected power becomes a predetermined value or less.

The controller 11b performs the control so as to determine the start time of the plasma generation, start the detection of the value of the emission intensity using the photosensor 11a, and stop the supply of the high-frequency signal according to the detection result of the emission intensity.

The power supply section 34 produces the high-frequency signal having the frequency of 80 MHz or the like in response to an instruction of the controller 11b.

Figure 3A:
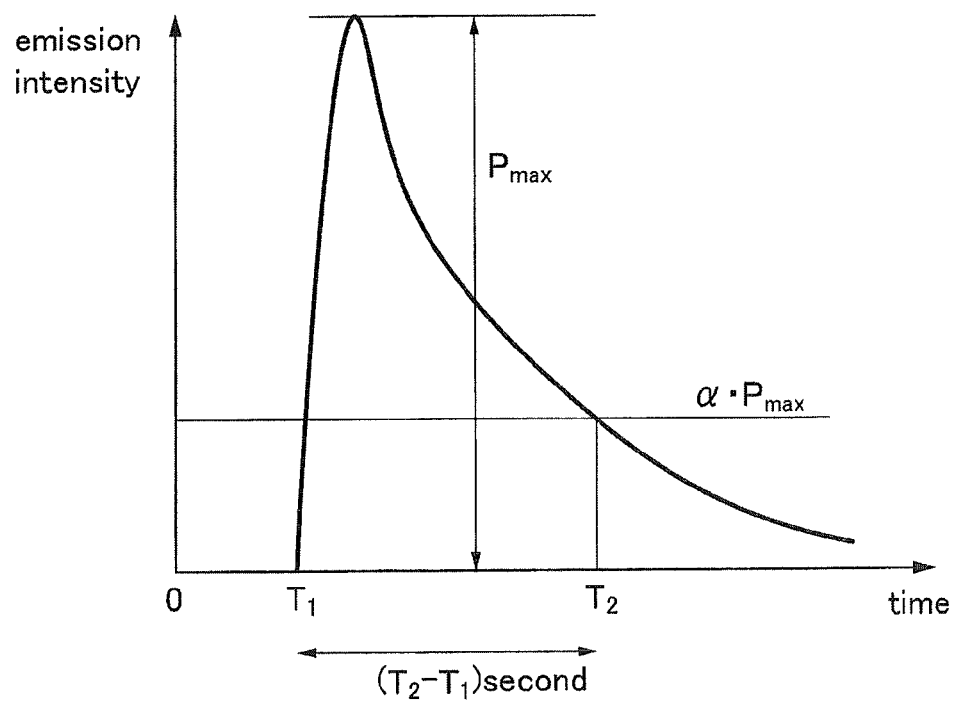
FIG. 3A is a graph illustrating an example of a temporal change in light intensity detected by a photosensor.
Figure 3B:
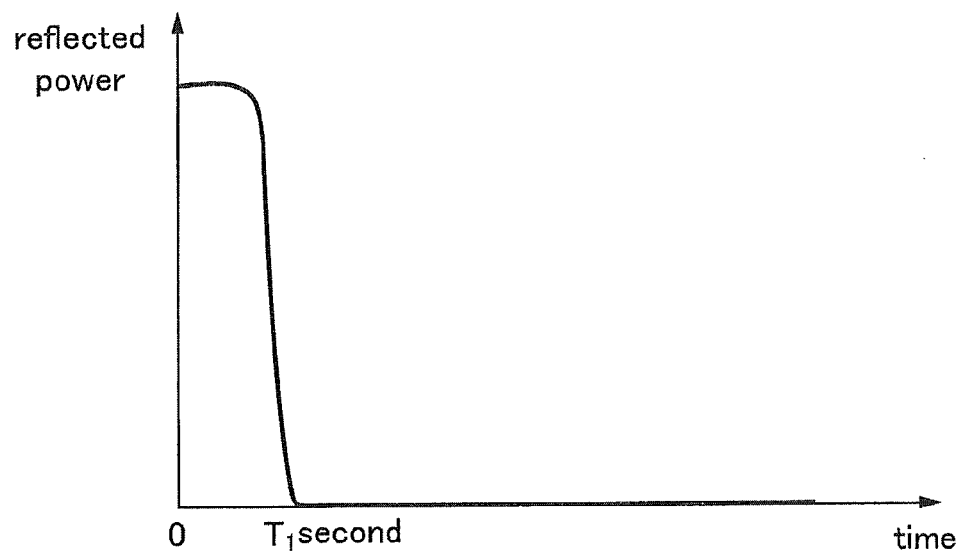
FIG. 3B is a graph illustrating an example of a temporal change in reflected power.

FIG. 3A is a graph illustrating an example of a temporal change in light intensity detected by a photosensor 31a. The supply of the high-frequency signal to the antenna element 26 is started at a time of 0 second. Then the plasma is generated and the light emission is generated by the hydrogen radical at a time of $T_1$ second(s). That is, the oxidation reaction is started. Then the emission intensity reaches a peak (emission intensity Pmax at the peak), and the emission intensity cuts across a threshold defined by $\alpha$ time ($\alpha$ is a predetermined value that is more than 0 and equal to or lower than 1) the emission intensity Pmax at a time of $T_2$ second(s). At this point, as illustrated in FIG. 3B, the reflected power becomes the predetermined value or less at the time of about $T_1$ second(s). That is, the plasma generation is started at the time of about $T_1$ second(s).

In such cases, the controller 11b sets the time of $T_1$ second(s) to the start time of the oxidation reaction, sets the time of $T_2$ second(s) to an end time of the oxidation reaction. and controls the detection of the light intensity using the photosensor 11a and the supply of the power using the power supply section 34.

In the embodiment, the plasma generation time is $(T_2-T_1)$ second(s). For example, assuming that $\alpha$ is 1/e (e is a base of a natural logarithm), the plasma generation time of $(T_2-T_1)$ second(s) is tens milliseconds. The plasma generation time of the embodiment is extremely shorter than the conventional plasma generation time that is fixed to hundreds milliseconds to several seconds.

Thus, in the ALD apparatus 10, the oxidized thin film is repeatedly formed in units of atomic layers, thereby forming the thin film having the desired thickness.

In the embodiment, because the progression of the oxidation reaction can be learned by the light emission of the hydrogen radical using the photosensor 11a, the end of the oxidation reaction can be learned. Because the thin film formed on the substrate is not unnecessarily exposed to the plasma for a long time, the film thickness and characteristics of the thin film become even than ever before. Because the unnecessary plasma generation time is eliminated, the thin film can efficiently be formed for a short time.

First, the ALD apparatus 10 introduces the organic metal gas containing hydrogen from the gas supply section 14 into the deposition vessel 12 to cause the component of the organic metal to be adsorbed on the substrate 42. Then the ALD apparatus 10 introduces the oxidizing gas containing O from the gas supply section 15 into the deposition vessel 12. At the same time. the ALD apparatus 10 feeds the power to the antenna element 26 to generate the plasma. The component of the organic metal adsorbed on the substrate is oxidized using the oxygen radical produced by the plasma.

The hydrogen radical is generated on the substrate when the plasma is generated and the oxidation reaction is started. The light is emitted when the hydrogen radical is excited and stabilized. The emission intensity of the light is detected by the photosensor 11a through the observation window 33 provided in the deposition vessel 12. When the value of the detected emission intensity becomes the predetermined value or less, the controller 11b stops the supply of the power from the power supply section 34 such that the plasma generation is stopped. When the organic metal gas and the oxidizing gas are alternately supplied, the gas may rightly be replaced in the deposition chamber 28 by causing an inert gas or the like to flow during the gas replacement.

On the other hand, when the high-frequency power is supplied to the antenna element 26 that generates the plasma, the reflected power is measured, and the detection of the value of the emission intensity is started based on the time the reflected power becomes the predetermined value or less. The emission intensity is detected using the bandpass filter having the transmission band of 655.3 to 657.3 nm.

In the embodiment, the metallic oxide film is formed using the oxidizing gas. The invention may also be applied when the metal is nitrided using the nitriding gas instead of the oxidizing gas.

The plasma can be generated using an inductively-coupled plasma source or a capacitively-coupled plasma source instead of the electromagnetically-coupled plasma source in which the antenna is used as the plasma source. That is, there is no particular restriction, but any plasma source may be used.

The atomic layer growing apparatus and the thin film forming method according to the embodiment of the invention are described in detail. However, the invention is not limited to the atomic layer growing apparatus and the thin film forming method of the embodiment. Obviously various changes and modifications can be made without departing from the scope of the invention.

DESCRIPTION OF LETTERS OR NUMERALS

ALD apparatus
10 feed unit
11a photosensor
11b controller
11c reflected power measuring section
12 deposition vessel
14, 15 gas supply section
16, 17 exhaust section
22, 23 supply pipe
24, 25 exhaust hole
26 antenna element
28 deposition chamber
29 shower head
30 heater
32 substrate stage
38 impedance matching box
39 monopole antenna
42 substrate
40 cylindrical member

What is claimed is:

1. A thin film forming method for forming a thin film, comprising a plurality of cycles of steps, each cycle including:
   introducing an organic metal gas containing hydrogen into a deposition vessel to cause a component of the organic metal containing hydrogen to be adsorbed on a substrate;

introducing an oxidizing gas or a nitriding gas into the deposition vessel, generating plasma with the oxidizing gas or the nitriding gas by a plasma source, and oxidizing or nitriding the component of the organic metal adsorbed on the substrate;

detecting emission intensity of a light emitted from an excited hydrogen radical separated from the organic metal absorbed on the substrate when the organic metal reacts with the oxidizing gas or the nitriding gas to form an oxidized metal or a nitride metal on the substrate;

setting a first predetermined value based on a maximum emission intensity of the detected light in each cycle; and stopping the generation of the plasma when a value of the detected emission intensity decreases from the maximum value to the first predetermined value or less.

2. The thin film forming method according to claim 1, further comprising supplying a high-frequency power to the plasma source to generate the plasma, measuring a reflected power of the high-frequency power reflected by the plasma source; and starting the detecting of the emission intensity when the reflected power decreases to a second predetermined value or less.

3. The thin film forming method according to claim 2, wherein the plasma is generated using the plasma source including an antenna array including a plurality of monopole antenna elements.

4. The thin film forming method according to claim 1, wherein an organic metal source gas and one of the oxidizing gas and the nitriding gas are alternately and repeatedly supplied to the deposition vessel, and a high-frequency power to the plasma source is repeatedly supplied every time one of the oxidizing gas and the nitriding gas is supplied to the deposition vessel, to form the oxidized metal or the nitride metal on the substrate.

5. The thin film forming method according to claim 1, wherein the emission intensity is detected using a bandpass filter having a transmission band of 655.3 to 657.3 nm when the emission intensity is detected.

* * * * *